(12) United States Patent
Wang et al.

(10) Patent No.: US 11,239,293 B2
(45) Date of Patent: Feb. 1, 2022

(54) ARRAY SUBSTRATE, DISPLAY PANEL, DISPLAY DEVICE AND METHOD FOR PREPARING ARRAY SUBSTRATE

(71) Applicant: BOE TECHNOLOGY GROUP CO., LTD., Beijing (CN)

(72) Inventors: Linlin Wang, Beijing (CN); Guang Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 16/618,495

(22) PCT Filed: May 6, 2019

(86) PCT No.: PCT/CN2019/085654
§ 371 (c)(1),
(2) Date: Dec. 2, 2019

(87) PCT Pub. No.: WO2019/214572
PCT Pub. Date: Nov. 14, 2019

(65) Prior Publication Data
US 2020/0127068 A1    Apr. 23, 2020

(30) Foreign Application Priority Data
May 11, 2018  (CN) .......................... 201810449127.X

(51) Int. Cl.
*H01L 27/32*    (2006.01)
*H01L 51/56*    (2006.01)
(52) U.S. Cl.
CPC .......... *H01L 27/3246* (2013.01); *H01L 51/56* (2013.01)

(58) Field of Classification Search
CPC . H01L 27/3246; H01L 27/3244; H01L 21/77; H01L 51/0021; H01L 51/56; H01L 27/3276
See application file for complete search history.

(56) References Cited

U.S. PATENT DOCUMENTS

| 8,629,463 B2 * | 1/2014 | Chung .................. H01L 27/326 257/88 |
| 8,766,097 B2 * | 7/2014 | Hwang .................. G06F 3/041 174/126.1 |

(Continued)

FOREIGN PATENT DOCUMENTS

| CN | 102623644 A | 8/2012 |
| CN | 107093680 A | 8/2017 |

(Continued)

OTHER PUBLICATIONS

International Search Report and Written Opinion, English Translation.

(Continued)

*Primary Examiner* — Mary A Wilczewski
(74) *Attorney, Agent, or Firm* — Brooks Kushman P.C.

(57) ABSTRACT

An array substrate includes a base substrate, a pixel definition layer, a light-emitting layer, and a plurality of auxiliary electrodes. A pixel definition layer is formed on the base substrate, and includes patterned retaining walls and a plurality of openings defined by the retaining walls. A surface of each of the retaining walls facing away from the base substrate is provided with a first groove. A light-emitting layer is formed on the retaining wall and in the plurality of openings. The light-emitting layer conformally covers respective first grooves of the retaining walls to form respective second grooves. Each of the plurality of auxiliary electrodes is formed in a respective one of the second grooves.

11 Claims, 3 Drawing Sheets

(56) References Cited

U.S. PATENT DOCUMENTS

| | | | | |
|---|---|---|---|---|
| 9,647,229 | B2* | 5/2017 | Nakazawa | H01L 27/3276 |
| 10,355,052 | B2* | 7/2019 | Lu | H01L 51/5221 |
| 10,483,335 | B2* | 11/2019 | Bang | H01L 51/504 |
| 10,978,527 | B2* | 4/2021 | Luo | H01L 27/3276 |
| 2005/0077816 | A1* | 4/2005 | Yamada | H01L 51/5228 |
| | | | | 313/503 |
| 2005/0116620 | A1* | 6/2005 | Kobayashi | H01L 51/5271 |
| | | | | 313/503 |
| 2005/0236629 | A1 | 10/2005 | Lee et al. | |
| 2011/0215329 | A1* | 9/2011 | Chung | H01L 51/52 |
| | | | | 257/59 |
| 2013/0134449 | A1 | 5/2013 | Chen et al. | |
| 2014/0353633 | A1* | 12/2014 | Lee | H01L 51/5228 |
| | | | | 257/40 |
| 2019/0173046 | A1* | 6/2019 | Jeong | H01L 27/3246 |
| 2019/0198588 | A1* | 6/2019 | Moon | H01L 51/0011 |
| 2019/0334112 | A1* | 10/2019 | Lee | H01L 51/5228 |
| 2020/0127068 | A1* | 4/2020 | Wang | H01L 51/56 |
| 2020/0266246 | A1* | 8/2020 | Bok | H01L 27/3272 |
| 2020/0321550 | A1* | 10/2020 | Hu | H01L 51/5234 |

FOREIGN PATENT DOCUMENTS

| | | |
|---|---|---|
| CN | 107331690 A | 11/2017 |
| CN | 107393945 A | 11/2017 |
| CN | 108511502 A | 9/2018 |

OTHER PUBLICATIONS

Second Office Action for Chinese Application No. 201810449127.X, dated Sep. 23, 2020, 8 Pages.

International Search Report and Written Opinion for Application No. PCT/CN2019/085654, dated Aug. 8, 2019, 9 Pages.

* cited by examiner

ARRAY SUBSTRATE, DISPLAY PANEL, DISPLAY DEVICE AND METHOD FOR PREPARING ARRAY SUBSTRATE

CROSS-REFERENCE TO RELATED APPLICATIONS

This application is the U.S. national phase of PCT Application No. PCT/CN2019/085654 filed on May 6, 2019, which claims priority to Chinese Patent Application No. 201810449127.X filed on May 11, 2018, which are incorporated herein by reference in their entireties.

TECHNICAL FIELD

The present disclosure relates to the field of display technology, in particular, to an array substrate, a display panel, a display device, and a method for preparing an array substrate.

BACKGROUND

The display device based on the top emission type organic light emitting diode (OLED) has become the main research direction due to the advantages of higher aperture ratio and ability to realize light extraction by using the microcavity effect. Top emission type OLED requires a top electrode to have good light transmission. Unfortunately, highly transparent electrode materials, such as indium tin oxide (ITO) and indium zinc oxide (IZO), tend to be less conductive than metals.

SUMMARY

According to an aspect of the present disclosure, an array substrate is provided, including: a base substrate; a pixel definition layer formed on the base substrate, in which the pixel definition layer includes patterned retaining walls and a plurality of openings defined by the retaining walls, and a surface of each of the retaining walls facing away from the base substrate is provided with a first groove; a light-emitting layer formed on the retaining walls and in the plurality of openings, in which the light-emitting layer conformally covers respective first grooves of the retaining walls to form respective second grooves; and a plurality of auxiliary electrodes, each of which is formed in a respective one of the second grooves.

In some embodiments, the array substrate further includes: a first conductive layer covering the light-emitting layer and the plurality of auxiliary electrodes. The first conductive layer is connected to the plurality of auxiliary electrodes.

In some embodiments, the array substrate further includes: a surface modifier formed at a groove bottom of each of the second grooves. The surface modifier has electrical conductivity and adhesion. each auxiliary electrode is formed on the surface modifier in corresponding second groove.

In some embodiments, the surface modifier comprises an aqueous solution of 3,4-ethylenedioxythiophene.

According to another aspect of the present disclosure, there is provided a display panel, including the array substrate as described above.

According to still another aspect of the present disclosure, there is provided a display device, including the display panel as described above.

According to still another aspect of the present disclosure, there is provided a method for preparing an array substrate, including: providing a base substrate; forming a pixel definition layer on the base substrate, in which the pixel definition layer includes patterned retaining walls and a plurality of openings defined by the retaining walls, and a surface of each of the retaining walls facing away from the base substrate is provided with a first groove; forming a light-emitting layer on the retaining wall and in the plurality of openings, in which the light-emitting layer conformally covers respective first grooves of the retaining walls to form respective second grooves; providing a stripper, in which the stripper is provided with a plurality of protruding auxiliary electrodes; pressing the stripper onto the light-emitting layer, in which each auxiliary electrode is aligned with corresponding second groove; and removing the stripper, such that each auxiliary electrode is embedded and attached to the interior of corresponding second groove.

In some embodiments, before the pressing the stripper onto the light-emitting layer, the method further includes providing a surface modifier at a groove bottom of each of the second grooves. The surface modifier has electrical conductivity and adhesion.

In some embodiments, the surface modifier includes an aqueous solution of 3,4-ethylenedioxythiophene.

In some embodiments, the step of providing the stripper includes: providing a stripper substrate with a surface on which a plurality of protrusions is provided; providing an anti-blocking agent on respective surfaces of the plurality of protrusions facing away from the stripper substrate; and forming each auxiliary electrode on the anti-blocking agent of the corresponding protrusion.

In some embodiments, the step of providing the anti-blocking agent includes: spin-coating tetrafluoroethylene on respective surfaces of the plurality of protrusions facing away from the stripper substrate.

In some embodiments, the step of providing the anti-blocking agent includes: preparing perfluorooctyltrichlorosilane by vapor deposition on respective surfaces of the plurality of protrusions facing away from the stripper substrate.

In some embodiments, the method further includes: forming a first conductive layer covering the light-emitting layer and the auxiliary electrodes. The first conductive layer is connected to the auxiliary electrodes.

DETAILED DESCRIPTION

Figure 1:
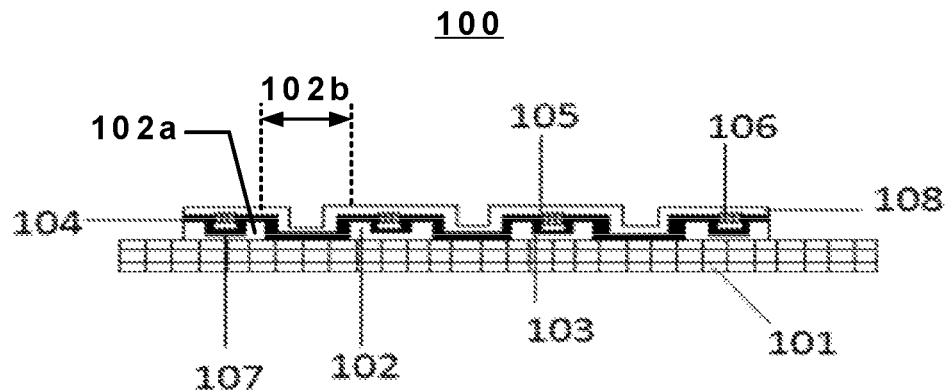
FIG. 1 is a schematic cross-sectional view showing an array substrate according to an embodiment of the present disclosure.

It will be understood that the terms, such as first, second, third, etc., may be used herein to describe various elements, components, regions, layers and/or portions, but these elements, components, regions, layers and/or portions should not be limited by these terms. These terms are merely used to distinguish one element, component, region, layer or portion form another element, component, region, layer or portion. Thus, a first element, component, region, layer, or portion discussed below may be referred to as a second element, component, region, layer or portion without departing from the teachings of the present disclosure.

For ease of description, terms expressed spatially relative position, such as "beneath", "below", "lower", "under", "above", "upper", etc., may be used to describe the relationship of one element or feature to another element or feature. It will be understood that these spatially relative terms are intended to encompass different orientations of the device in use or operation in addition to the orientation depicted in the drawings. For example, if the device in the drawings is turned over, elements described as "below other elements or features" or "beneath other elements or features" or "under other elements or features" will be oriented "above other elements or features". Thus, the exemplary term "below" and "under" can encompass both orientations above and below. Terms, such as "before" or "prior to" and "after" or "followed", may be similarly used, for example, to indicate the order in which light passes through the elements. The device can be oriented in other ways (rotated 90 degrees or in other orientations), and the spatially relative descriptors used herein interpreted accordingly. In addition, it will also be understood that when a layer is referred to as "between two layers", it may be a single layer between the two layers, or one or more intermediate layers may be present.

The term used herein is merely for the purpose of describing particular embodiments, and is not intended to limit the present disclosure. As used herein, the singular forms "a", "an" and "the" are intended to include the plural forms as well, unless the context clearly indicates otherwise. It will be further understood that the terms "comprise" and/or "include", when used in the specification, are intended to specify the presence of features, integers, steps, operations, elements, and/or components, but does not exclude the presence or addition of one or more other features, integers, steps, operations, elements, components, and/or groups thereof in one or more other features, integers, steps, operations, elements, components, and/or groups thereof. The term "and/or" as used herein includes any and all combinations of one or more of the associated listed items.

It will be understood that when an element or layer is referred to as "on another element or layer", "connected to another element or layer", "coupled to another element or layer" or "proximate to another element or layer", it can be directly on another element or layer, directly connected to another element or layer, directly coupled to another element or layer or directly proximate to another element or layer, or there may be an intermediate element or layer. In contrast, when an element is referred to as "directly on another element or layer", "directly connected to another element or layer", "directly coupled to another element or layer" or "directly proximate to another element or layer", there is no intermediate element or layer. However, in any case "on" or "directly on" should not be construed as requiring that one layer completely covers the underlying layer.

The illustrative embodiments (and intermediate structures) of the idealized embodiments of the present disclosure are described herein with reference to the embodiments of the present disclosure. As such, it is contemplated that for example the changes in the illustrated shapes as a result of manufacturing techniques and/or tolerances. Thus, embodiments of the present disclosure should not be construed as limited to the particular shapes of the regions illustrated herein, but should include, for example, a shape deviation due to manufacturing. Thus, the region illustrated in the drawings is illustrative in nature, and the shape thereof is neither intended to illustrate the actual shape of the region of the device, nor intended to limit the scope of present disclosure.

All terms (including technical and scientific terms) used herein have the same meaning as commonly understood by a person skilled in the art to which the present disclosure belongs, unless otherwise defined. It should be further understood that terms such as those defined in commonly used dictionaries should be interpreted into the meanings consistent with their meanings in the related art and/or the context of the specification, not interpreted into idealized or extremely formalized meanings, unless explicitly defined herein.

A solution of using a metal as an auxiliary electrode of a top electrode of an OLED has been proposed, in which an auxiliary electrode is formed by photolithography in a region covered by a black matrix (BM). This solution may include a BM process, a color film (CF) process, an auxiliary electrode process, a spacer (PS) process, and an ITO process. These processes are complicated in process, of higher cost, and are not suitable for mass production. In order to illustrate the above purposes, features and advantages in the embodiments of the present disclosure in a clear manner, embodiments of the present disclosure will be further described in detail below in conjunction with the drawings.

FIG. 1 shows a schematic cross-sectional view showing an array substrate 100 according to an embodiment of the present disclosure.

Referring to FIG. 1, the array substrate 100 includes a base substrate 101, a pixel definition layer 102, a light-emitting layer 104, and a plurality of auxiliary electrodes 106.

The base substrate 101 may be made of any suitable material such as glass or resin. A pixel circuit (not shown) arranged in an array is formed inside the base substrate 101. Each of pixel circuits includes a plurality of thin film transistors (TFT) and other electronic components (e.g., capacitors), and is used to drive OLED illumination in a respective sub-pixel region.

The pixel definition layer 102 is formed on the base substrate 101. The pixel definition layer 102 includes a patterned retaining wall 102a and a plurality of openings 102b defined by the retaining walls. Each opening 102b defines one light-emitting region of respective sub-pixel region. A surface of each of the retaining walls 102a facing away from the base substrate 101 is provided with a first groove 103. The first groove has a depth in the range of, for example, 600 nm to 900 nm. The size of the first groove 103 depends on the size of the retaining wall 102a. The pixel definition layer 102 may be formed of a material, such as polyimide, poly(methyl methacrylate), and organosilane.

A light-emitting layer 104 is formed on the retaining wall 102a and in the plurality of openings 102b. The light-emitting layer 104 conformally covers respective first grooves 103 of respective retaining walls 102a to form respective second grooves 105. Specifically, the light-emitting layer 104 follows the surface of respective first groove 103 of each of the retaining walls 102a, so that the orthogonal projections of respective second grooves 105 on the pixel definition layer 102 are located in respective first grooves 103. It will be understood that although the light-emitting layer 104 is shown as extending continuously in FIG. 1, this is merely schematic and illustrative. In practice, the light-emitting layer 104 is patterned, and different sub-pixel regions may include respective light-emitting layers defined from one another.

A plurality of auxiliary electrodes 106 are formed in respective second grooves 105. The auxiliary electrode 106 may be made of a conductive metal such as aluminum or silver. Aluminum or silver ensures good electrical conductivity. The auxiliary electrode 106 has a thickness in the range of, for example, 400 nm to 800 nm, thereby preventing the auxiliary electrode 106 from being too thin to be easily broken.

In this embodiment, the array substrate 100 further includes a first conductive layer 108 covering the light-emitting layer 104 and the plurality of auxiliary electrodes 106. The first conductive layer 108 may be made of a material having high transparency and conductivity, such as indium tin oxide (ITO) or indium zinc oxide (IZO). The first conductive layer 108 typically has a thickness between 100 nm and 200 nm. The first conductive layer 108 is connected to the plurality of auxiliary electrodes 106. Due to the presence of the auxiliary electrode 106, the conductivity of the first conductive layer 108 is improved.

In this embodiment, the bottom of each of the second grooves 105 is covered with a surface modifier 107. As shown in FIG. 1, each auxiliary electrode 106 is formed on the surface modifier 107 in corresponding second groove 105. The surface modifier 107 has electrical conductivity and adhesion. The surface modifier 107 can include, for example, an aqueous solution of 3,4-ethylenedioxythiophene. Advantageously, the adhesion of the surface modifier 107 to the metal is higher than the adhesion of the metal to other organic materials, such that the auxiliary electrode 106 is more easily adhered to the interior of the second groove 105 without the phenomenon of peripheral adhesion.

It will be understood that some of the elements in array substrate 100 are not shown in FIG. 1 in order not to obscure the subject matter of the present disclosure. For example, the pixel circuit inside the base substrate 101 is not shown. Moreover, the second conductive layer on the upper surface of the base substrate 101 is also not shown. The second conductive layer is patterned into a plurality of electrodes arranged in an array to correspond to respective sub-pixel regions. These electrodes can be used as anodes of the OLED, and each anode can be connected to the drain electrode for driving TFT of a respective pixel circuit in the base substrate 101. In practice, a second conductive layer is first formed and patterned on the base substrate 101, and then the pixel definition layer 102 is formed and patterned on the patterned second conductive layer, thereby forming a retaining wall 102a and an opening 102b.

In the array substrate 100, the conductivity of the top electrode (first conductive layer 108) of the OLED is improved by forming the auxiliary electrode 106 in the second groove 105. Moreover, as will be further described later, the preparation process of the array substrate 100 is simple, thereby improving the production efficiency.

Figure 2:
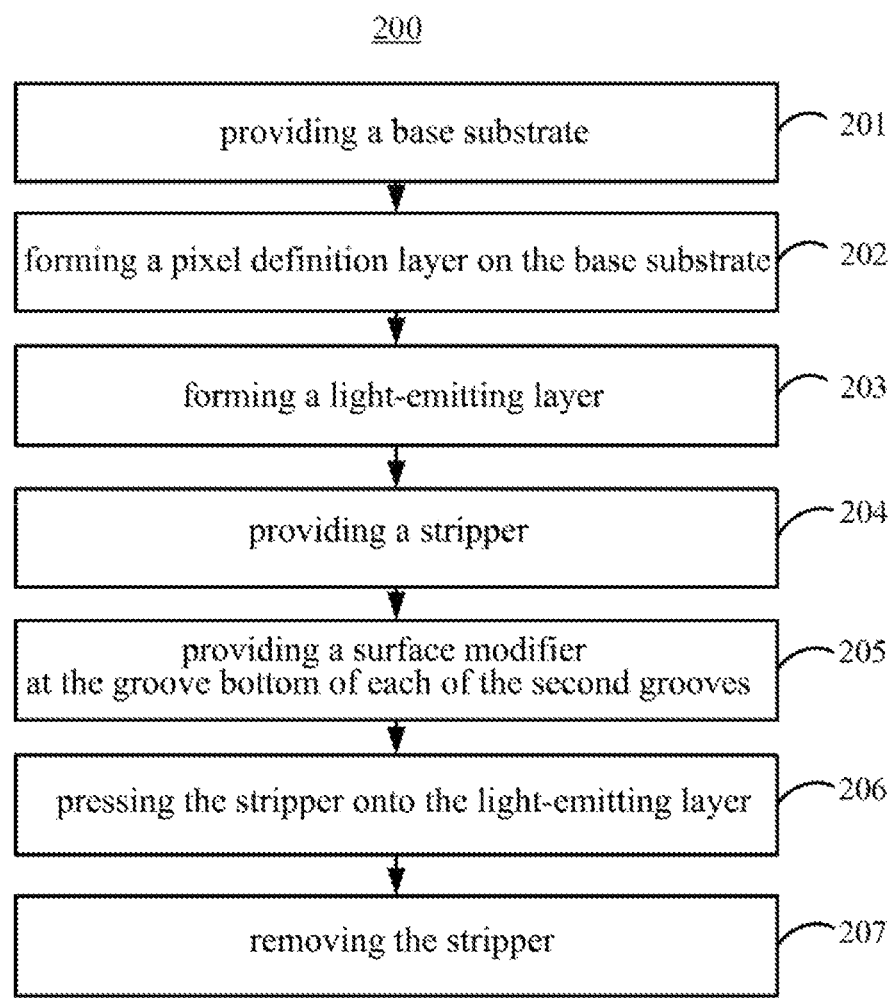
FIG. 2 is a flow chart showing a method for preparing an array substrate according to an embodiment of the present disclosure.

FIG. 2 shows a flow chart showing a method 200 for preparing an array substrate according to an embodiment of the present disclosure, and FIGS. 3 to 6 show schematic cross-sectional views showing structures obtained from various steps in method 200. The processing flow of the method 200 will be described below with reference to FIGS. 2 to 6.

Figure 3:
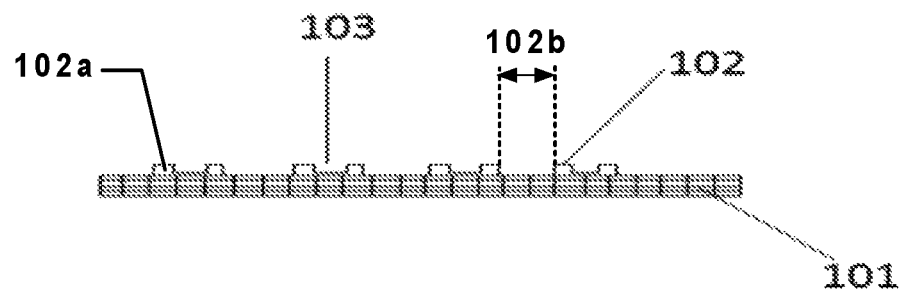
FIG. 3 is a schematic cross-sectional view showing a structure obtained after forming a pixel definition layer on a base substrate in the method of FIG. 2.

At step 201, a base substrate, such as the base substrate 101 shown in FIG. 3, is provided.

At step 202, a pixel definition layer 102 is formed on the base substrate 101. As shown in FIG. 3, the pixel definition layer 102 includes a patterned retaining wall 102a and a plurality of openings 102b defined by the retaining wall 102a. The pixel definition layer 102 can be formed by a one-step lithography process. The pixel definition layer 102 may be made of a photoresist material, such as polyimide, poly(methyl methacrylate) or organosilane. A surface of each of the retaining walls 102a facing away from the base substrate 101 is provided with a first groove 103. Each of the first grooves 103 may be formed on respective retaining wall 102a by laser etching. Specifically, the first groove 103 may be formed by laser irradiation of the retaining wall 102a using a mask, or the first groove 103 may be formed by directly controlling laser irradiation to the retaining wall 102a. In other embodiments, the first groove 103 can also be formed by other means.

As previously described, a second conductive layer (not shown) has been formed on the base substrate 101 before the pixel definition layer 102 is formed. The second conductive layer is patterned into a plurality of electrodes that can be used as an anode of the OLED.

Figure 4:
FIG. 4 is a schematic cross-sectional view showing a structure obtained by covering a pixel definition layer with a light-emitting layer in the method of FIG. 2.

At step 203, a light-emitting layer 104 is formed. A light-emitting layer 104 is formed on the retaining wall 102a and in the plurality of openings 102b, as shown in FIG. 4. The light-emitting layer 104 conformally covers respective first grooves 103 of respective retaining walls 102a to form respective second grooves 105. An orthogonal projection of the second groove 105 on the pixel definition layer 102 is located within the first groove 103.

Figure 5:
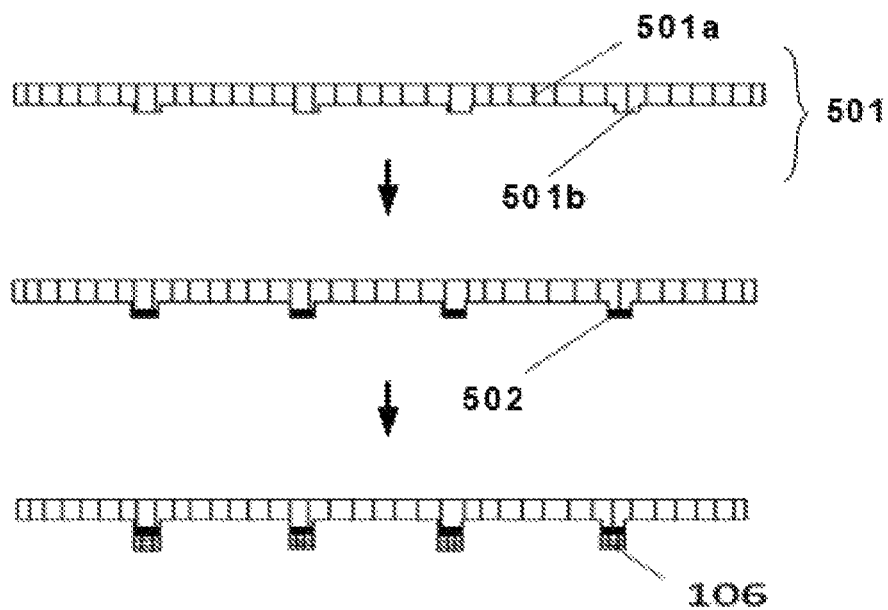
FIG. 5 is a schematic view showing the process of preparing a stripper in the method of FIG. 2.

At step 204, a stripper 501 is provided. The stripper 501 is provided with a plurality of protruding auxiliary electrodes 106. Referring to FIG. 5, an exemplary preparation process for stripper 501 includes the following steps.

First, a stripper substrate 501a is provided with a surface (the lower surface in FIG. 5) on which a plurality of protrusions 501b is provided. Respective protrusions 501b correspond to respective second grooves 105. Next, an anti-blocking agent 502 is provided on respective surfaces of the plurality of protrusions 501b facing away from the stripper substrate 501a. Then, each auxiliary electrode 106 is formed on the anti-blocking agent 502 of corresponding protrusion 501b.

In some embodiments, the providing the anti-blocking agent 502 may include: spin-coating tetrafluoroethylene on respective surfaces of the plurality of protrusions 501b facing away from the stripper substrate 501a. Alternatively, in some embodiments, perfluorooctyltrichlorosilane is prepared by vapor deposition on respective surfaces of the plurality of protrusions 501b facing away from the stripper substrate 501a, to provide an anti-blocking agent 502.

Advantageously, the anti-blocking agent 502 can prevent the auxiliary electrode 106 from being detached from the stripper 501, i.e., preventing the auxiliary electrode 106 from sticking too tightly to the protrusion 501a, after its subsequent assembly into the second groove 105.

Figure 6:
FIG. 6 is a schematic cross-sectional view showing a structure obtained by pressing a stripper onto a light-emitting layer and then removing the stripper in the method of FIG. 2.

At step 205, a surface modifier 107 is formed on the bottom groove of the second groove 105. In this embodiment, the surface modifier 107 may be formed on the groove bottom of the second groove 105 by using an organic solution having conductivity and adhesion, as shown in FIG. 6. This enables the auxiliary electrode layer 106 on the stripper 501 to be more easily adhered to the interior of the second groove 105, without affecting the conductivity of the auxiliary electrode layer 106. In some embodiments, 3,4-ethylenedioxythiophene (PEDOT-PSS) can be selected as the surface modifier 107.

At step 206, the stripper 501 is pressed onto the light-emitting layer 104. Specifically, each auxiliary electrode 106 is aligned with corresponding second groove 105. More specifically, the prepared stripper 501 is pressed against the light-emitting layer 104 at a certain pressure (for example, 0 bar to 40 bar) in an atmosphere of a certain temperature (for example, 60 degrees Celsius to 90 degrees Celsius) for a certain time (for example, 50 s to 70 s). The pressure, temperature, and press time values can be adjusted based on the size of the auxiliary electrode 106 and the depth of the second groove 105.

At step 207, the stripper 501 is removed, such that each auxiliary electrode 106 is embedded and attached to the interior of corresponding second grooves 105. Specifically, when a certain pressure is applied to the stripper 501, it is removed from the light-emitting layer 104, and each auxiliary electrode 106 is attached to the interior of corresponding second groove 105, as shown in FIG. 6.

In some embodiments, the first conductive layer 108 covering the light-emitting layer 104 and the plurality of auxiliary electrodes 106 is formed, resulting in an array substrate 100 as shown in FIG. 1. The thickness of the first conductive layer 108 is in the range of, for example, 1200 Å (angstroms) to 1800 Å.

In the method 200, by forming the first groove 103 on the retaining wall 102a of the pixel definition layer 102, and by forming the auxiliary electrode 106 in the second groove 105, the preparation process of the array substrate is simplified, and the preparation efficiency of the array substrate is improved. Advantageously, the conductivity of the first conductive layer 108 (the top electrode of the OLED) is increased due to the presence of the auxiliary electrode 106.

Figure 7:
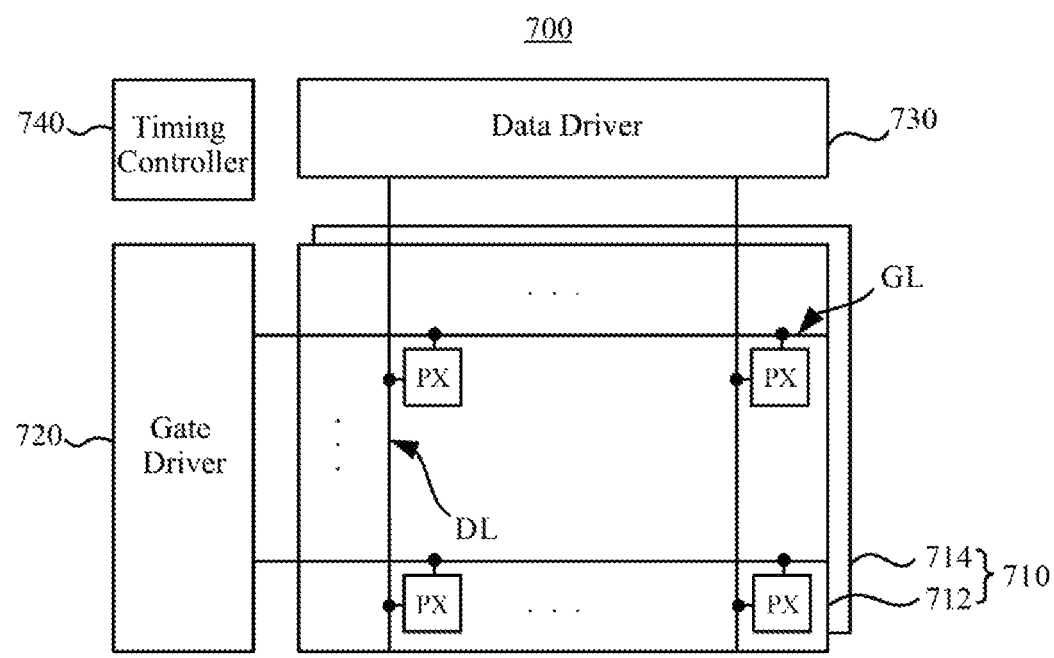
FIG. 7 is a schematic block diagram showing a display device according to an embodiment of the present disclosure.

FIG. 7 is a schematic block diagram showing a display device 700 according to an embodiment of the present disclosure. By way of example but not limitation, the display device 700 may be a mobile phone, a tablet computer, a television, a display, a notebook computer, a digital photo frame, a navigator, or any product or component having a display function.

Referring to FIG. 7, the display device 700 includes a display panel 710, a gate driver 720 configured to output a gate scan signal to the display panel 710, a data driver 730 configured to output a data voltage to the display panel 710, and a timing controller 740 configured to control the gate driver 720 and the data driver 730.

The display panel 710 includes an array substrate 712 and an opposite substrate 714 opposite to the array substrate 712. In the case of an organic light-emitting diode display device, the opposite substrate 714 may be a cover plate. The array substrate 712 includes a plurality of sub-pixel regions PX arranged in an array. Each of the sub-pixel regions PX is located at a respective intersection between the plurality of gate lines GL and the plurality of data lines DL. Each sub-pixel region includes a thin-film transistor (not shown) and other associated electronic components. The array substrate 712 may take the form of any of the array substrate 100 described above with respect to FIGS. 1 to 6 and variations thereof.

The gate driver 720 is electrically connected to the first end of respective gate lines GL, thereby sequentially applying gate scan signals to respective gate lines GL. In some exemplary embodiments, the gate driver 720 can be mounted (e.g., integrated) directly into the array substrate 712. Alternatively, the gate driver 720 may be connected to the display panel 710 through a tape carrier package (TCP).

The data driver 730 is electrically connected to the first ends of respective data lines DL, to output data voltages to respective data lines DL. In some embodiments, data driver 730 can include a plurality of data driver chips operating in parallel.

The timing controller 740 controls the operation of the gate driver 720 and the data driver 730. Specifically, the timing controller 740 outputs data control signals and image data to control the driving operation of the data driver 730, and outputs gate control signals to control the driving operation of the gate driver 720. The data control signal and image data are applied to the data driver 730. A gate control signal is applied to the gate driver 720.

The array substrate, the display panel, the display device, and the method for preparing the array substrate provided by the present disclosure are described in detail above. The principles and implementations of the present disclosure are described by using specific embodiments. The description of the above embodiments is merely used for helping to understand the core idea of the present disclosure. Variations and modifications of the specific embodiments can be made by a person skilled in the art according to the ideas of the present disclosure. Therefore, the described embodiments shall be not construed as limiting the present disclosure.

Although the foregoing embodiments of the method are described as a series of action combinations for the sake of simple description, a person skilled in the art should understand that the present disclosure is not limited by the described sequence of actions, because some steps may be performed in other sequences or simultaneously without departing from the scope of the present disclosure. A person skilled in the art should also understand that the embodiments described in the description all belong to specific embodiments, and the actions and modules involved are not necessarily required by the present disclosure. Therefore, it should be understood that the embodiments of the present disclosure are not limited to the specific embodiments disclosed, and modifications and other embodiments are intended to be included within the scope of the appended claims.

What is claimed is:

1. An array substrate, comprising:
   a base substrate;
   a pixel definition layer formed on the base substrate, wherein the pixel definition layer comprises patterned retaining walls and a plurality of openings defined by the retaining walls, and a surface of each of the retaining walls facing away from the base substrate is provided with a first groove;
   a light-emitting layer formed on the retaining walls and in the plurality of openings, wherein the light-emitting layer conformally covers respective first grooves of the retaining walls to form respective second grooves;
   a plurality of auxiliary electrodes, each of which is formed in a respective one of the second grooves; and
   a surface modifier formed at a groove bottom of each of the second grooves,
   wherein the surface modifier has electrical conductivity and adhesion, wherein each auxiliary electrode is formed on the surface modifier in corresponding second groove, and wherein the surface modifier comprises an aqueous solution of 3,4-ethylenedioxythiophene.

2. The array substrate of claim 1, further comprising:
a first conductive layer covering the light-emitting layer and the plurality of auxiliary electrodes,
wherein the first conductive layer is connected to the plurality of auxiliary electrodes.

3. A display panel, comprising the array substrate of claim 1.

4. The display panel of claim 3, wherein the array substrate further comprises:
a first conductive layer covering the light-emitting layer and the plurality of auxiliary electrodes,
wherein the first conductive layer is connected to the plurality of auxiliary electrodes.

5. A display device, comprising the display panel of claim 3.

6. The display device of claim 5, wherein the array substrate further comprises:
a first conductive layer covering the light-emitting layer and the plurality of auxiliary electrodes,
wherein the first conductive layer is connected to the plurality of auxiliary electrodes.

7. A method for preparing an array substrate of claim 1, comprising:
providing a base substrate;
forming a pixel definition layer on the base substrate, wherein the pixel definition layer comprises patterned retaining walls and a plurality of openings defined by the retaining walls, and a surface of each of the retaining walls facing away from the base substrate is provided with a first groove;
forming a light-emitting layer on the retaining wall and in the plurality of openings, wherein the light-emitting layer conformally covers respective first grooves of the retaining walls to form respective second grooves;
providing a surface modifier at the groove bottom of each of the second grooves;
providing a stripper, wherein the stripper is provided with a plurality of protruding auxiliary electrodes;
pressing the stripper onto the light-emitting layer, wherein each auxiliary electrode is aligned with a corresponding second groove; and
removing the stripper, such that each auxiliary electrode is embedded and attached to an interior of the corresponding second groove.

8. The method of claim 7, wherein the step of providing the stripper comprises:
providing a stripper substrate with a surface on which a plurality of protrusions is provided;
providing an anti-blocking agent on respective surfaces of the plurality of protrusions facing away from the stripper substrate; and
forming each auxiliary electrode on the anti-blocking agent of a corresponding protrusion.

9. The method of claim 7, wherein the step of providing the anti-blocking agent comprises:
spin-coating tetrafluoroethylene on respective surfaces of the plurality of protrusions facing away from the stripper substrate.

10. The method of claim 7, wherein the step of providing the anti-blocking agent comprises:
preparing perfluorooctyltrichlorosilane by vapor deposition on respective surfaces of the plurality of protrusions facing away from the stripper substrate.

11. The method of claim 7, further comprising:
forming a first conductive layer covering the light-emitting layer and the auxiliary electrodes,
wherein the first conductive layer is connected to the auxiliary electrodes.

* * * * *